(12) United States Patent
Murase et al.

(10) Patent No.: US 11,488,784 B2
(45) Date of Patent: Nov. 1, 2022

(54) CAPACITOR

(71) Applicant: Murata Manufacturing Co., Ltd., Nagaokakyo (JP)

(72) Inventors: Yasuhiro Murase, Nagaokakyo (JP); Tomoyuki Ashimine, Nagaokakyo (JP); Hiroshi Nakagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 163 days.

(21) Appl. No.: 16/998,058

(22) Filed: Aug. 20, 2020

(65) Prior Publication Data

US 2020/0381181 A1 Dec. 3, 2020

Related U.S. Application Data

(63) Continuation of application No. PCT/JP2019/015678, filed on Apr. 10, 2019.

(30) Foreign Application Priority Data

Apr. 27, 2018 (JP) .............................. JP2018-087140

(51) Int. Cl.
*H01G 4/33* (2006.01)
*H01L 49/02* (2006.01)
*H01L 21/283* (2006.01)
*H01G 4/12* (2006.01)

(52) U.S. Cl.
CPC .............. *H01G 4/33* (2013.01); *H01G 4/1209* (2013.01); *H01L 21/283* (2013.01); *H01L 28/90* (2013.01)

(58) Field of Classification Search
CPC ......... H01L 27/10829; H01L 27/10861; H01L 28/40; H01L 28/90; H01L 28/55; H01L 28/56; H01G 4/33
See application file for complete search history.

(56) References Cited

U.S. PATENT DOCUMENTS

| 6,967,135 | B1 | 11/2005 | Lee |
| 8,247,303 | B2 | 8/2012 | Inoue et al. |
| 8,710,626 | B2 | 4/2014 | Inoue et al. |
| 9,455,151 | B2 | 9/2016 | Bauer et al. |
| 9,917,146 | B2 | 3/2018 | Bauer et al. |
| 2011/0233724 | A1 | 9/2011 | Inoue et al. |
| 2012/0280359 | A1 | 11/2012 | Inoue et al. |

(Continued)

FOREIGN PATENT DOCUMENTS

| CN | 1722384 A | | 1/2006 |
| DE | 10219204503 | * | 3/2020 |

(Continued)

OTHER PUBLICATIONS

International Search Report issued for PCT/JP2019/015678, dated Jul. 2, 2019.

(Continued)

*Primary Examiner* — Thanhha S Pham
(74) *Attorney, Agent, or Firm* — ArentFox Schiff LLP

(57) ABSTRACT

A capacitor that includes a substrate having a main surface with at least one of a recess or a projection, a dielectric film extending along the at least one of the recess or the projection and having an equivalent oxide thickness of 600 nm or more, and a conductor film covering at least part of the dielectric film.

13 Claims, 4 Drawing Sheets

(56) References Cited

U.S. PATENT DOCUMENTS

2015/0145104 A1  5/2015  Bauer et al.
2016/0365408 A1  12/2016  Bauer et al.

FOREIGN PATENT DOCUMENTS

| JP | H0521808 A | 1/1993 |
| JP | 2011204927 A | 10/2011 |
| JP | 2014078661 A | 5/2014 |
| JP | 2014241434 A | 12/2014 |
| JP | 2015111671 A | 6/2015 |

OTHER PUBLICATIONS

Written Opinion of the International Searching Authority issued for PCT/JP2019/015678, dated Jul. 2, 2019.
Chinese Office Action issued for Chinese Application No. 201980015302.7, dated Jul. 15, 2021.

* cited by examiner

CAPACITOR

CROSS REFERENCE TO RELATED APPLICATIONS

The present application is a continuation of International application No. PCT/JP2019/015678, filed Apr. 10, 2019, which claims priority to Japanese Patent Application No. 2018-087140, filed Apr. 27, 2018, the entire contents of each of which are incorporated herein by reference.

FIELD OF THE INVENTION

The present invention relates to a capacitor. The present invention particularly relates to a high withstand voltage Si capacitor.

BACKGROUND OF THE INVENTION

Japanese Patent Application Laid-Open No. 2014-241434 (Patent Document 1) describes an example of a capacitor. In the capacitor described in this document, a plurality of grooves are formed on the surface of a substrate region, and a dielectric film is formed so as to cover the uneven face generated by these grooves.

Patent Document 1: Japanese Patent Application Laid-Open No. 2014-241434

SUMMARY OF THE INVENTION

If the thickness of the dielectric layer is increased, the withstand voltage increases. However, when the thickness of the dielectric layer is excessively increased, the residual stress in the dielectric layer increases. When the residual stress is large, there is a possibility that the capacitor will crack or warp.

Therefore, an object of the present invention is to provide a capacitor that can withstand a high voltage and can be prevented from cracking or warping.

In order to achieve the object, the capacitor according to the present invention includes a substrate having a main surface with at least one of a recess or a projection, a dielectric film extending along the at least one of the recess or the projection and having an equivalent oxide thickness of 600 nm or more, and a conductor film covering at least part of the dielectric film.

According to the present invention, the capacitor can withstand a high voltage and can be prevented from cracking or warping.

DETAILED DESCRIPTION OF THE INVENTION

Figure 1:
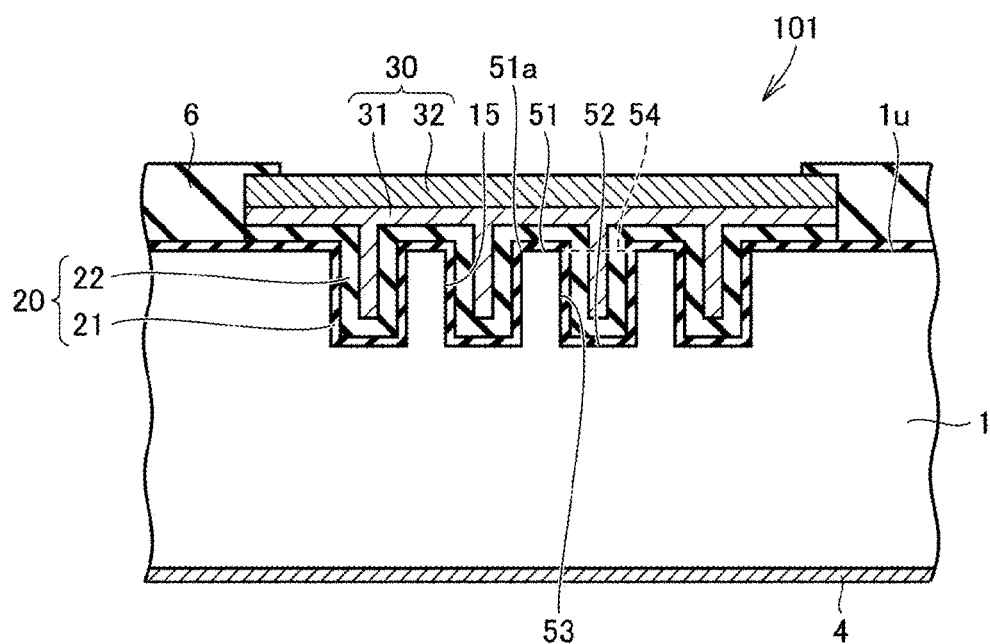
FIG. 1 is a sectional view of a capacitor in Embodiment 1 according to the present invention.

The dimensional ratios shown in the drawings do not always faithfully represent the actual dimensional ratios, and are sometimes exaggerated for convenience of description. Thus, the drawings are not to scale. In the case of referring to a concept of an upper or lower position in the following description, the concept does not necessarily mean an absolute upper or lower position, but sometimes means a relative upper or lower position in the configuration shown in the drawing.

Embodiment 1

A capacitor in Embodiment 1 according to the present invention will be described with reference to FIG. 1. FIG. 1 shows a sectional view of a capacitor 101 in the present embodiment.

The capacitor 101 includes a substrate 1, a dielectric film 20, and a conductor film 30. The substrate 1 has a main surface $1u$. The substrate 1 is, for example, a silicon substrate, and is formed using low-resistance Si such as conductive n-type Si or p-type Si. When the substrate 1 has conductivity, the substrate 1 may be electrically connected to a back surface electrode 4 described below. The main surface $1u$ has a recess 15. The dielectric film 20 covers at least part of the main surface $1u$. The dielectric film 20 is formed along the recess. The dielectric film 20 has an equivalent oxide thickness (also referred to as "EOT") of 600 nm or more. The conductor film 30 covers the dielectric film 20.

In the case that the oxide film is an $SiO_2$ film, the equivalent oxide thickness (EOT) of a high dielectric constant film has the following relationship to the physical film thickness T and the dielectric constant ε of the high dielectric constant film and the dielectric constant of the $SiO_2$ film $εSiO_2$.

$$EOT = εSiO_2 \times T/ε$$

The recess 15 on the main surface $1u$ has a bottomed tubular shape. The recess 15 includes a first portion 51 formed on the same plane as the main surface $1u$, a second portion 52 corresponding to the bottom of the recess 15, a third portion 53 corresponding to the tube portion of the recess 15 and connecting the second portion 52 and the first portion 51, and a fourth portion 54 being an opening of the recess 15. The substrate 1 has a surface covered with the back surface electrode 4 opposite from the main surface $1u$. In the case that the substrate 1 has no conductivity, a conductor film (not shown) is formed on the surface of the recess, and the dielectric film 20 is formed on the conductor film.

In the example shown here, the dielectric film 20 has a two-layer structure of a base film 21 and an oxide film 22. A polysilicon film 31 is formed so as to cover the dielectric film 20. The polysilicon film 31 is formed in a region surrounded by the second portion 52 and the third portion 53 of the recess 15. An aluminum electrode 32 is formed so as to cover the polysilicon film 31. The conductor film 30 includes the polysilicon film 31 and the aluminum electrode 32. In the main surface $1u$, a region not covered with the conductor film 30 is covered with a protective film 6. The protective film 6 may cover a part of the conductor film 30. The base film 21 may be interposed between the protective film 6 and the main surface $1u$.

Practically, the capacitor is required to withstand a voltage of 600 V, so that the EOT of the dielectric film 20 is required to be 600 nm or more considering that the withstand voltage performance of $SiO_2$ is 10 MV/cm. In the present embodiment, because the EOT of the dielectric film 20 is 600 nm or more, it is possible to realize a capacitor that can withstand a high voltage of 600 V. In other words, the capacitor can sufficiently withstand a high voltage. Because the EOT of the dielectric film 20 is thick, a sufficient thickness can be easily ensured even in a portion, such as the edge of the first portion 51 of the recess 15, that is easily sharpened and easily has a thinner dielectric film than the second portion, so that the occurrence of dielectric breakdown due to the application of a high voltage can be suppressed, and the withstand voltage can be increased. In the present embodiment, because the dielectric film 20 having a sufficient thickness is provided, a crack in the capacitor is prevented, and the warp can be suppressed to be small.

As shown in the present embodiment, the dielectric film 20 preferably includes a laminated structure having two or more layers. For example, a configuration can be considered in which the base film 21 is a nitride film, and the oxide film 22 is an oxide film formed by CVD. If the dielectric film 20 includes the laminated structure having two or more layers, the selection of the method of forming a film is widened, so that a desired thickness can be easily realized.

Here, while an example is shown in which the upper layer in the two-layer structure of the conductor film 30 is the aluminum electrode 32, another kind of metal film may be used instead of the aluminum electrode 32.

Embodiment 2

Figure 2:
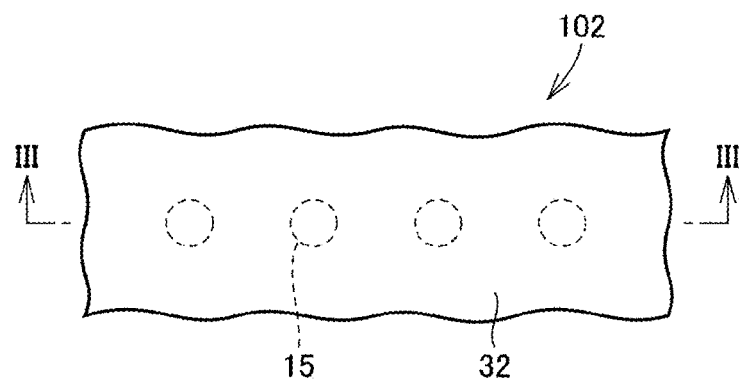
FIG. 2 is a partial plan view of a capacitor in Embodiment 2 according to the present invention.
Figure 3:
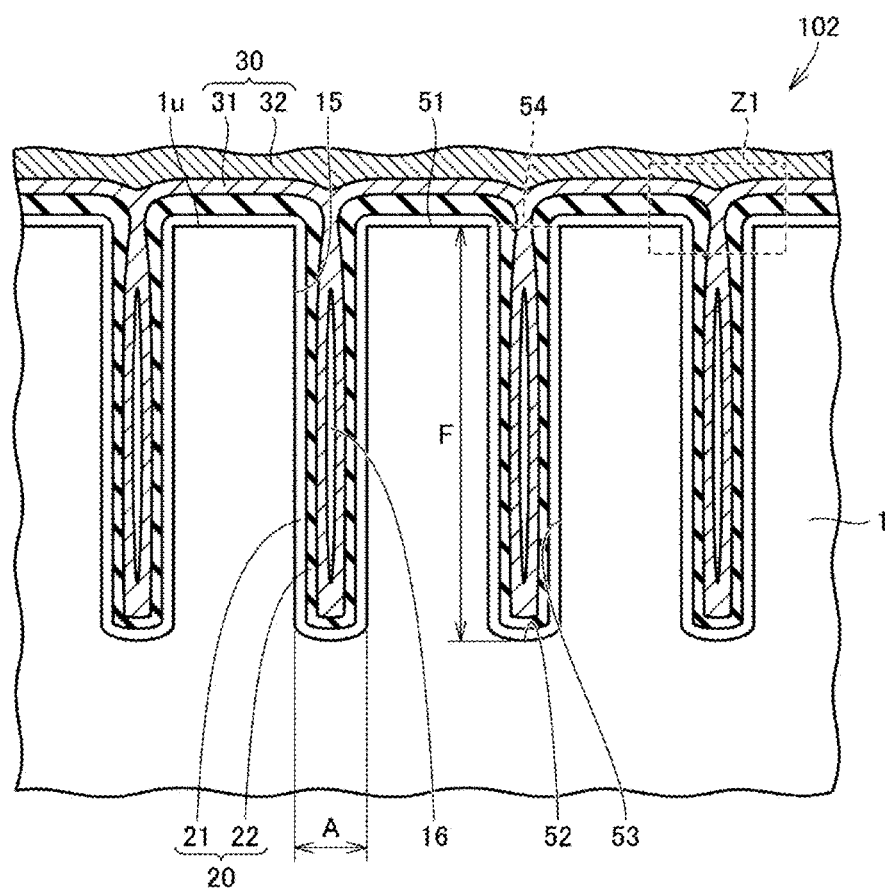
FIG. 3 is a sectional view taken along the line III-III in FIG. 2.
Figure 4:
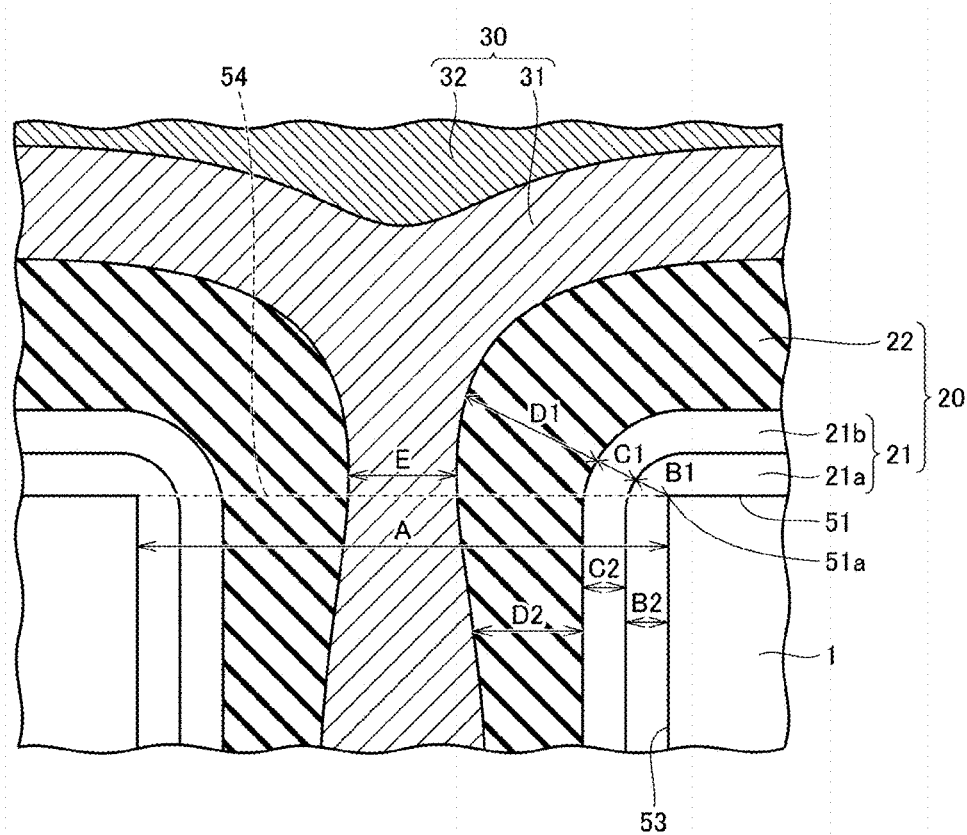
FIG. 4 is an enlarged view of a Z1 portion in FIG. 3.

The capacitor in Embodiment 2 according to the present invention will be described with reference to FIGS. 2 to 4. FIG. 2 shows a partial plan view of a capacitor 102 in the present embodiment. FIG. 3 shows a sectional view taken along the line III-III in FIG. 2. FIG. 4 shows an enlarged view of a Z1 portion in FIG. 3.

In the present embodiment, a substrate 1 is a silicon substrate. A base film 21 includes an oxide film 21a and a nitride film 21b. The oxide film 21a may be, for example, an $SiO_2$ film. The nitride film 21b may be, for example, an SiN film. The oxide film 21a directly covers the substrate 1, and the nitride film 21b covers the oxide film 21a. A recess 15 has a depth F of, for example, 20.8 μm. The recess 15 has a diameter A of, for example, 3.9 μm.

The oxide film 21a is a thermal oxide film. An oxide film 22 is an oxide film formed by a CVD method. The thickness of a dielectric film 20 measured obliquely at an edge 51a of the recess 15 can be understood as the sum of the thickness B1 of the oxide film 21a, the thickness C1 of the nitride film 21b, and the thickness D1 of the oxide film 22. The edge 51a is the boundary between a first portion 51 and a third portion 53. The thickness of the dielectric film 20 measured horizontally at a depth in the recess 15 can be understood as the sum of the thickness B2 of the oxide film 21a, the thickness C2 of the nitride film 21b, and the thickness D2 of the oxide film 22. The thicknesses of the oxide film 22 satisfies the relationship of D1>D2. A polysilicon film 31 has a diameter E that is the smallest diameter in the vicinity of an opening 54. Inside the recess 15, the polysilicon films 31 may be separated from each other in a direction parallel to a main surface 1u, as shown in FIG. 3, with the recess 15 not completely filled with the polysilicon film 31. In other words, in the region surrounded by the second portion 52 and the third portion 53 in the recess 15, the dielectric film and a conductor film are formed, and a space may be further formed. In other words, the polysilicon film 31 formed so as to cover the dielectric film 20 that extends inside the recess 15 may not completely fill the recess 15. That is, inside the recess 15, there may be a gap on the surface of the polysilicon film 31 opposite from the dielectric film 20 side. For example, as shown in FIG. 3, there may be a gap 16 between the polysilicon films 31 inside the recess 15.

Although the structure is illustrated in which the opening formed in the dielectric film 20 is closed by the polysilicon film 31 in the portion where the polysilicon has a diameter that is the smallest in the vicinity of the opening 54, the polysilicon films 31 may be separated from each other. In other words, in the region surrounded by the second portion 52 and the third portion 53 in the recess 15, the dielectric film 20 and the polysilicon film 31 are formed, a space is further formed, and the space may be covered with the same material as an aluminum electrode 32. The same applies in the case that the electrode is formed using a conductive material other than aluminum. As described above, the structure in which the polysilicon films are separated from each other or the structure in which the space is formed is effective for relaxing the residual stress. At this time, the dielectric film 20 may have an EOT of less than 600 nm. Such a structure may be used in a low withstand voltage capacitor. The thickness of the dielectric film 20 measured obliquely at the edge 51a of the first portion 51 is larger than the thickness of the dielectric film 20 in the second portion 52.

The thickness of the dielectric film referred to here was measured by a scanning electron microscope (SEM) in a region where the dielectric film was relatively thin. The region where the dielectric film is relatively thin is a region where the dielectric breakdown strength is smaller than in the surroundings.

In the present embodiment, the dielectric film 20 includes a laminated structure having three or more layers. Here, the example is shown in which the dielectric film 20 includes the laminated structure having three layers, and the laminated structure may have four or more layers.

In the present embodiment, the dielectric film 20 includes a laminated structure having three or more layers, so that the withstand voltage performance can be improved. At the edge 51a of the first portion 51 that is generally a high portion in the main surface, electric field concentration tends to occur because of the sharpening of the edge 51a. However, in the present embodiment, the dielectric film 20 is sufficiently thick so that an electric field concentration can be relaxed even at the edge 51a.

As shown in the present embodiment, the laminated structure of the dielectric film 20 preferably includes an oxide film, a nitride film, and an oxide film that are laminated in that order. By employing this configuration, a layer having a low band gap can be sandwiched between two layers having a high band gap inside the laminated structure so that the leakage current characteristic and the insulation resistance can be improved, and the capacitor can have high reliability. As a result, the withstand voltage performance of the capacitor can be improved.

The uppermost layer in the laminated structure of the dielectric film 20 preferably has a smaller residual stress than any other layer in the laminated structure. By employing this configuration, warping can be suppressed.

The uppermost layer in the laminated structure of the dielectric film 20 preferably contains a component that is any one selected from the group consisting of hydrogen, water, and carbon at a content more than a content of the component in any other layer in the laminated structure. By employing this configuration, it is possible to easily realize a state in which the uppermost layer has a smaller residual stress than any other layer.

As shown in the present embodiment, the uppermost layer in the laminated structure of the dielectric film 20 preferably has a larger thickness than any other layer in the laminated structure. By employing this configuration, a desired thickness can be easily realized.

As shown in the present embodiment, the uppermost layer in the laminated structure of the dielectric film 20 preferably has a thickness larger than a total thickness of all other layers in the laminated structure. By employing this configuration, the withstand voltage performance can be improved.

The uppermost layer in the laminated structure of the dielectric film 20 is preferably an oxide film that is not a thermal oxide film. An oxide film that is not a thermal oxide film is, for example, an oxide film formed by a CVD method. In the example shown in the present embodiment, the oxide film 22 is formed by a CVD method. For example, the oxide film 21a has a compressive stress, and the nitride film 21b has a tensile stress. The oxide film 22 corresponding to the uppermost layer in the laminated structure of the dielectric film 20 has a weak compressive stress. With such a combination, the stress can be canceled out to some extent inside the laminated structure, and the warp can be suppressed. The oxide film that is not a thermal oxide film here may be formed by a method other than a CVD method.

The laminated structure of the dielectric film 20 preferably includes an oxide film, a nitride film, an oxide film, a nitride film, and an oxide film that are laminated in this order. By employing this configuration, the leakage current characteristic and the insulation resistance can be further improved, and the capacitor can have high reliability. As a result, the withstand voltage performance of the capacitor can be improved.

The conductor film 30 preferably has a region in which the conductor films 30 face each other and are not in contact with each other on the dielectric film 20 formed along the recess 15.

By employing the configuration in which, as shown in FIG. 3, the polysilicon films 31 are separated from each other in a direction parallel to the main surface 1u, or the dielectric film and the conductor film are formed and a space is further formed in the region surrounded by the second portion 52 and the third portion 53 in the recess 15, the residual stress can be relaxed by the space. Alternatively, the space can suppress the occurrence of a crack or a warp due to thermal expansion.

(Result of Experiment)

Figure 5:
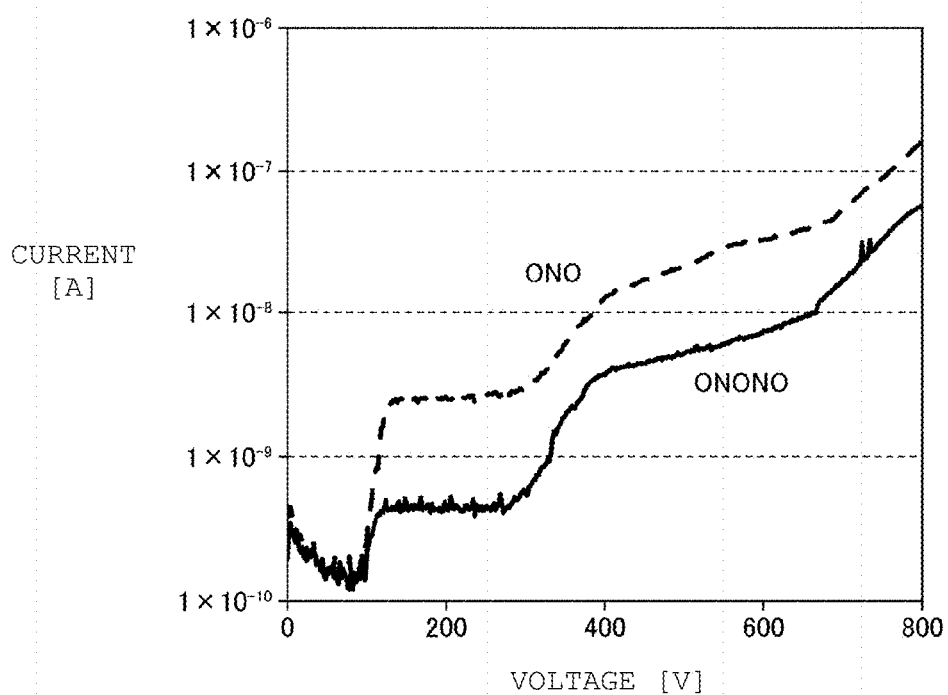
FIG. 5 is a graph showing a result of an experiment for examining a leak current when a voltage is applied to a capacitor according to the present invention.

FIG. 5 shows a result of an experiment with a recess 15 having a depth of 30 μm and at a temperature of 200° C. FIG. 5 is a graph showing the relationship between the applied voltage and the flowing leak current. In FIG. 5, the case indicated as "ONO" is a case that the dielectric film 20 includes the laminated structure that is a three-layer structure having an oxide film, a nitride film, and an oxide film in order, that is, a so-called ONO film. The case indicated as "ONONO" is a case that the dielectric film 20 includes the laminated structure that is a five-layer structure having an oxide film, a nitride film, an oxide film, a nitride film, and an oxide film in that order, that is, a so-called ONONO film. From FIG. 5, it can be seen that the leakage current can be reduced more in the case where the dielectric film 20 is an ONONO film than in the case where the dielectric film 20 is an ONO film. That is, it can be seen that the insulation performance against the high voltage is improved.

Embodiment 3

Figure 6:
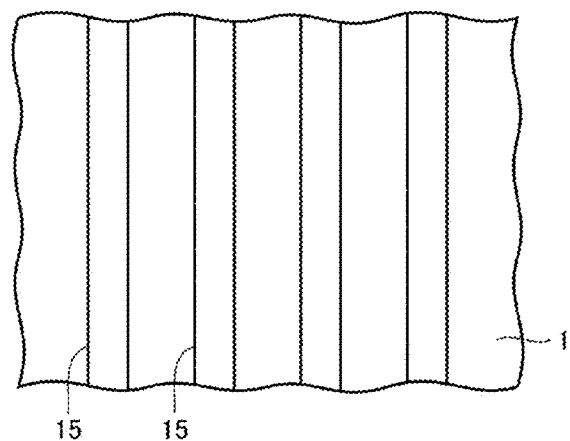
FIG. 6 is a partial plan view of a capacitor in Embodiment 1 according to the present invention.

In Embodiments 1 and 2, the recess 15 is provided so as to have a circular spot shape when seen in a plan view, and in Embodiment 3 according to the present invention, a recess 15 is provided in a groove shape as shown in FIG. 6. In FIG. 6, the upper surface of a substrate 1 is shown in a state that each layer covering a main surface 1u of the substrate 1 is removed. A plurality of groove-shaped recesses 15 are provided in parallel. Even if the recess 15 is provided in a groove shape, the same effect as described in Embodiments 1 and 2 can be obtained.

Figure 7:
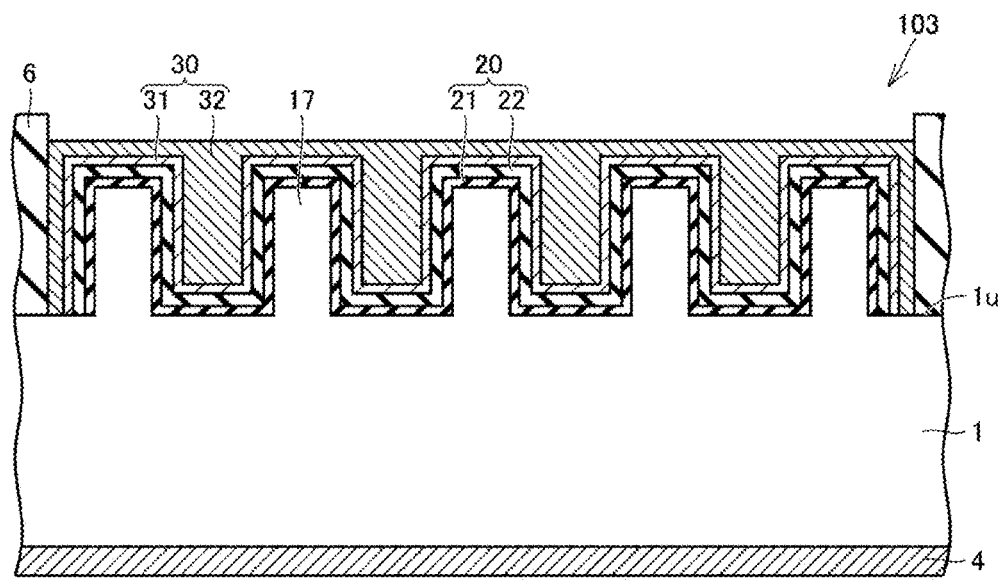
FIG. 7 is a sectional view of a capacitor in the case that a projection is employed instead of a recess.

In each Embodiment described above, the structure is shown in which the recess 15 is provided on the main surface 1u, and instead of such a structure, the structure may be employed in which, as in a capacitor 103 illustrated in FIG. 7, a projection 17 is provided on the main surface 1u. A dielectric film 20 is formed so as to cover the surface of the projection 17, and a polysilicon film 31 is formed so as to further cover the dielectric film 20. An aluminum electrode 32 is placed so as to cover the films. A conductor film 30 includes the polysilicon film 31 and the aluminum electrode 32. The conductor film 30 extends in the gap between the projections 17. Even in the case that the projection 17 is employed, it is possible to obtain the same effect as that of the capacitor in which the recess 15 is employed.

Note that a plurality of features from each of the Embodiments described above may be appropriately combined and employed. The Embodiments described herein are merely examples and are not restrictive. The scope of the present invention is to therefore be defined by the claims, and includes any equivalent features and all modifications within the scope of the present invention.

DESCRIPTION OF REFERENCE SYMBOLS

1: Substrate
1u: Main surface
4: Back surface electrode
6: Protective film
15: Recess
16: Gap
17: Projection
20: Dielectric film
21: Base film
21a: Oxide film
21b: Nitride film
22: Oxide film
30: Conductor film
31: Polysilicon film
32: Aluminum electrode
51: First portion
51a: Edge
52: Second portion
53: Third portion
54: Fourth portion
101, 102, 103: Capacitor

The invention claimed is:
1. A capacitor, comprising:
a substrate having a main surface with at least one of a recess or a projection;

a dielectric film extending along the at least one of the recess or the projection and having an equivalent oxide thickness of 600 nm or more; and a conductor film covering at least part of the dielectric film, wherein the dielectric film is a laminated structure having two or more layers, wherein an uppermost layer in the laminated structure has a smaller residual stress than any other layer in the laminated structure, and wherein the uppermost layer in the laminated structure contains at least one component selected from the group consisting of hydrogen, water, and carbon at a content more than a content of the component in any other layer in the laminated structure.

2. The capacitor according to claim 1, wherein there is a gap between opposed portions of the conductor film in a region thereof that extends along the at least one of the recess or the projection.

3. The capacitor according to claim 1, wherein the laminated structure includes an oxide film, a nitride film, and an oxide film that are laminated in that order.

4. The capacitor according to claim 1, wherein the uppermost layer in the laminated structure has a thickness larger than any other layer in the laminated structure.

5. The capacitor according to claim 4, wherein the thickness of the uppermost layer in the laminated structure is larger than a total thickness of all other layers in the laminated structure.

6. The capacitor according to claim 1, wherein the uppermost layer in the laminated structure is an oxide film that is not a thermal oxide film.

7. The capacitor according to claim 1, wherein the laminated structure includes an oxide film, a nitride film, an oxide film, a nitride film, and an oxide film that are laminated in that order.

8. A capacitor comprising:

a substrate having a main surface with at least one of a recess or a projection;

a dielectric film extending along the at least one of the recess or the projection and having an equivalent oxide thickness of 600 nm or more; and a conductor film covering at least part of the dielectric film, wherein the dielectric film is a laminated structure having three or more layers, wherein an uppermost layer in the laminated structure has a smaller residual stress than any other layer in the laminated structure, and wherein the uppermost layer in the laminated structure contains at least one component selected from the group consisting of hydrogen, water, and carbon at a content more than a content of the component in any other layer in the laminated structure.

9. The capacitor according to claim 8, wherein the laminated structure includes an oxide film, a nitride film, and an oxide film that are laminated in that order.

10. The capacitor according to claim 8, wherein the uppermost layer in the laminated structure has a thickness larger than any other layer in the laminated structure.

11. The capacitor according to claim 10, wherein the thickness of the uppermost layer in the laminated structure is larger than a total thickness of all other layers in the laminated structure.

12. The capacitor according to claim 8, wherein the uppermost layer in the laminated structure is an oxide film that is not a thermal oxide film.

13. The capacitor according to claim 8, wherein the laminated structure includes an oxide film, a nitride film, an oxide film, a nitride film, and an oxide film that are laminated in that order.

* * * * *